United States Patent [19]
Ikeya

[11] Patent Number: 6,033,235
[45] Date of Patent: Mar. 7, 2000

[54] SOCKET APPARATUS PARTICULARLY ADAPTED FOR BGA TYPE SEMICONDUCTOR DEVICES

[75] Inventor: Kiyokazu Ikeya, Mansfield, Mass.

[73] Assignee: Texas Instruments Incorporated, Dallas, Tex.

[21] Appl. No.: 09/191,404

[22] Filed: Nov. 12, 1998

[30] Foreign Application Priority Data

Nov. 27, 1997 [JP] Japan ................................. 9-342274

[51] Int. Cl.⁷ ........................................... H01R 9/09
[52] U.S. Cl. .................................... 439/71; 439/331
[58] Field of Search ............................. 439/70, 71, 72, 439/73, 331

[56] References Cited

U.S. PATENT DOCUMENTS

| | | | |
|---|---|---|---|
| 5,247,250 | 9/1993 | Rios | 439/70 |
| 5,419,710 | 5/1995 | Pfaff | 439/71 |
| 5,456,613 | 10/1995 | McHugh | 439/268 |
| 5,615,824 | 4/1997 | Fjelstad et al. | 29/840 |
| 5,632,631 | 5/1997 | Fjelstad et al. | 439/82 |
| 5,641,945 | 6/1997 | Abe et al. | 439/70 |
| 5,690,281 | 11/1997 | Ikeya et al. | 439/268 |
| 5,744,759 | 4/1998 | Ameen et al. | 439/67 |
| 5,802,699 | 9/1998 | Fjelstad et al. | 361/768 |
| 5,829,988 | 11/1998 | McMillan et al. | 439/70 |
| 5,947,751 | 9/1999 | Massingill | 439/70 |
| 5,951,305 | 9/1999 | Haba | 439/70 |

*Primary Examiner*—Neil Abrams
*Attorney, Agent, or Firm*—Russell E. Baumann; Richard L. Donaldson

[57] ABSTRACT

A socket (1) for removably receiving semiconductor devices (8) for testing purposes has film contacts (81) each having a continuous or discontinuous annulus (71, 73, 76, 78) that has been formed on a film substrate and with a recess (72, 74, 77, 79) formed within the annulus exposed at a bottom of a seating or accommodating portion (31). When a BGA type semiconductor device (8) is received in the accommodating part (31) and a cover (16) is closed, electrically conductive balls (9) on the bottom of the semiconductor device (8) are pressed against respective film annular contacts (81, 82, 83, 84) thereby effecting an electric connection. Since the bottom most portion of the electrically conductive balls (9) are located within the recesses of the annular contacts, they will not be deformed. Since the film contacts (81) are prepared by etching and plating, the pitch can be easily narrowed, or otherwise modified.

10 Claims, 16 Drawing Sheets

SOCKET APPARATUS PARTICULARLY ADAPTED FOR BGA TYPE SEMICONDUCTOR DEVICES

FIELD OF THE INVENTION

This invention relates generally to a socket used in conducting electrical tests of semiconductor devices and more particularly to a socket which is capable of holding semiconductor devices for such electrical tests without damaging the electrically conductive terminals of a BGA (ball grid array) type of semiconductor device.

BACKGROUND OF THE INVENTION

Generally, a silicon substrate with integrated circuits formed thereon is divided after an electrical operating test in a wafer state, with the semiconductor chips of an acceptable product being sealed in a package of plastic, ceramic or the like as an electric element. As the necessity arises, suitable connecting means such as BGA or the like is provided on the package so that the inner electric element and an outer circuit can be electrically interconnected. After sealing the package, an appropriate electrical test, such as a burn-in test is carried out and the acceptable semiconductor devices are shipped for sale. In connection with an electrical test such as the burn-in test, a socket in which the semiconductor device can be easily inserted or removed is used in view of the necessity of quickly testing a large number of semiconductor devices.

FIGS. 13(a)–13(d) show a socket made according to the prior art which is used for burn-in tests for semiconductor devices of the BGA type. Socket 201 has a base 211 and a cover 216. A plurality of test pins 243 are mounted on the bottom of base 211. The leg portion 244 of each test pin 243 protrudes downwardly from base 211 and the top part 241 is arranged in a selected array on base 211. A semiconductor device 208 of the BGA type is inserted into an accommodating part 231 provided at a prescribed location on base 211 and the semiconductor balls 209, arranged in the selected array on the bottom, are caused to engage the top part 241 of respective test pins 243. In this state, cover 216 is pivoted with a spring 222, provided between cover 216 and base 211, being compressed. Another spring 223 which cooperates with latch 217 mounted on cover 216 is compressed when cover 216 is forced downwardly covering base 211 with latch 217 being engaged with an engaging part 215 formed on base 211. The force of spring 223 maintains the cover in the closed position. With the cover closed and latched, semiconductor device 208 is compressed by the spring force of test pins 243 through cover 216 so that the electrically conductive balls 209 are pressed against the top part 241 of the test pins.

Leg parts 244 of test pins 243 are soldered to the wiring pattern (not shown) on the circuit board and, in the state where the electrically conductive balls 208 are pressed against top portions 241 of test pins 243, the electric element in semiconductor device 208 is interconnected with the circuit board or a test circuit that has been provided elsewhere through electrically conductive balls 209 and test pins 243. When the circuit is activated and a prescribed electrical signal is impressed on semiconductor device 208, the desired electrical test, e.g., a burn-in test, can be conducted in a desired atmosphere. After completion of the test, the engagement of latch 217 is released, cover 216 is opened, the semiconductor device 208 whose test has been completed is removed from base 211 and an untested semiconductor device 208 is inserted into accommodating part 231, thereby making it possible to speedily exchange semiconductor devices 208.

In the case of the above-described socket 201, however, it is necessary to exert a large force on semiconductor device 208 and press the lower portion of electroconductive balls 209 against the surface of top parts 241 of test pins 243 in order to obtain a suitable electrical connection between electrically conductive balls 209 and test pins 243. This has caused a problem in that the lower part of the electrically conductive balls 209 can become deformed and cause a degree of flatness and concomitant deterioration in the electrical connection between electrically conductive balls 209 that have been arranged in the selected array and test pins 243, thereby generating a failure in connection at the time of the actual mounting for its intended purpose. In recent years, moreover, the number of terminals of the semiconductor device 208 has been increased and the size of the distance between the electrically conductive balls 209 has been reduced. In order to cope with this trend, if the test pins were to be made finer, the spring force of the test pins 243 would be weakened with a resultant problem that the contact resistance between electrically conductive balls 209 and test pins 243 would increase. Further, in order to modify the upper portions 241 of test pins 243 to accommodate the reduced pitch of the electrically conductive balls 209, it would be necessary to reduce the pitch between the top parts 241 as well. This presents a problem in that the thickness of the partitions which provide electrical insulation would be excessively reduced so that the electrical isolation between the pins would be compromised.

SUMMARY OF THE INVENTION

An object of the present invention is to overcome the above noted limitations in the prior art. Another object is to provide a socket which is suitable for use in the testing of BGA type semiconductors of a narrow pitch which avoids connection failures at the time of the actual mounting for their intended use.

Briefly described, a socket made in accordance with the invention comprises a film substrate having electrically conductive film contacts arranged on a base. A semiconductor device with electrically conductive balls arranged in a selected array at the bottom thereof is accommodated in the socket and, when placed on the film substrate, the film contacts engage the peripheral part of each respective electrically conductive ball yet out of engagement with the bottom most portion of the electrically conductive balls.

According to a feature of the invention, the film contacts are composed of electrically conductive material, each possessing a ring-shaped protuberant stripe. According to another feature of the invention, the film substrate has connecting parts which are electrically connected with connecting pins that have been mounted on the base and a wiring film interconnects the connecting parts and the respective film contacts. According to yet another feature of the invention, an adaptor with an accommodating part for the accommodation of a semiconductor device provided thereon is mounted on the film substrate in such a manner as to be interchangeable with adaptors having accommodation parts for semiconductors having a different size or array. The adaptor has a compression part which presses the connecting parts to respective connecting pins. A cover is pivotably received on the base with the semiconductor device horizontally accommodated in the accommodating part and, when the cover is pivoted toward the base, the semiconductor device is pressed in a perpendicular direction by a compression block which is mounted on the cover.

In accordance with the invention, a semiconductor device of the BGA type having electrically conductive balls arranged in a selected array on the bottom thereof is accommodated in the accommodating part of the socket with the electrically conductive balls engaging the film contacts which are exposed through the bottom of the accommodating part so that the electric element in the semiconductor device is interconnected with the film substrate. As the top edge of the film contacts engage the peripheral part of the electrically conductive balls, the bottom most portion of the electrically conductive balls are maintained out of engagement with the film contact. Accordingly, there is no deformation or crushing of the electrically conductive balls so that the configuration of the lower portion of the electrically conductive balls that have been arranged in the selected array is not affected. If, moreover, the electrically conductive balls are made to press against the film contacts by a spring that has been provided on the cover or the base, there will be no increase in the contact resistance even if the size of the electrically conductive balls is reduced. In accordance with the invention, the film contacts can be constructed by forming the protruding stripes made of an electrically conductive material in the shape of a ring.

In view of the fact that there is a need for the film contacts to be concentrated in the vicinity of the center of the film substrate in conformity with the selected array of the electrically conductive balls at the bottom of the semiconductor device, connecting parts may be provided on the film substrate, connected to the film contacts by a wiring film, so that it becomes possible to increase the distance between the connecting parts by placing the connecting parts along the peripheral part of the film substrate. Accordingly, it becomes possible to cause the connecting parts to contact the respective connecting pins that have been mounted on the base and electrically interconnect the film contacts and the circuit board. Moreover, if an interchangeable adaptor is arranged on the film substrate with a semiconductor device accommodated in a seat that has been provided in the adaptor and the electrically conductive balls are caused to engage the film contacts which have been exposed at the bottom of the seat, it becomes possible to test various shapes of BGA type semiconductor devices by merely exchanging the film substrate and the adaptor. According to a feature of the invention, a compression part is formed on the adaptor for pressing the connecting parts of the film substrate against the respective connecting pins.

Further, if a pivotable cover is mounted on the base and the semiconductor device is accommodated horizontally in the container part when the cover is pivoted toward the base, the semiconductor device is pressed in a perpendicular direction by the compression block that has been mounted on the cover so that the film contacts cut evenly into the periphery of the electrically conductive balls, thereby making optimum electrical connection.

These and other advantages of the invention will be more fully understood by reference to the drawings and the following detailed description.

DETAILED DESCRIPTION OF PREFERRED EMBODIMENT

Figure 10:
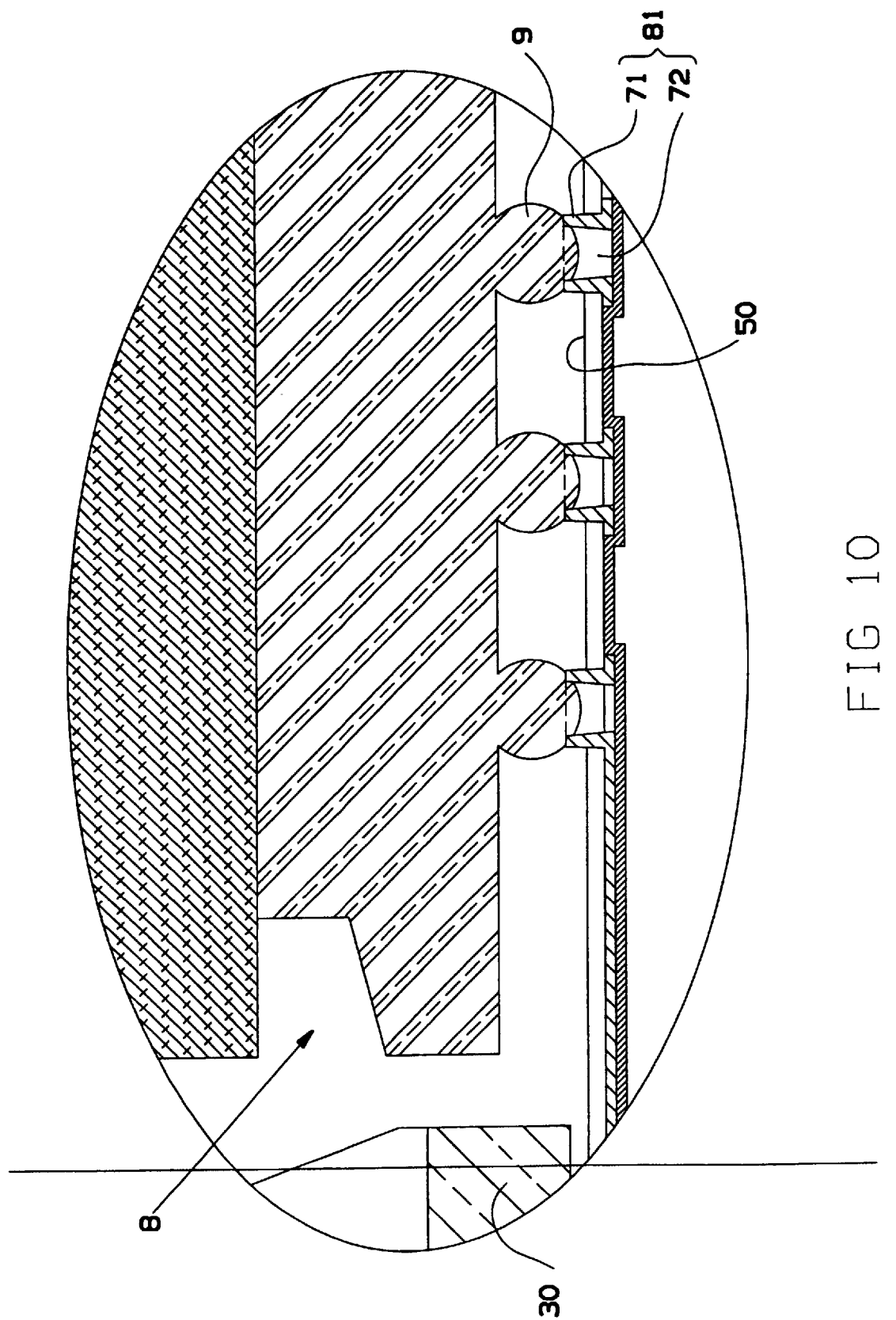
FIG. 10 is an enlarged cross sectional view shown for explaining the state of contact between the ball grid array and the film contact.
Figure 11:
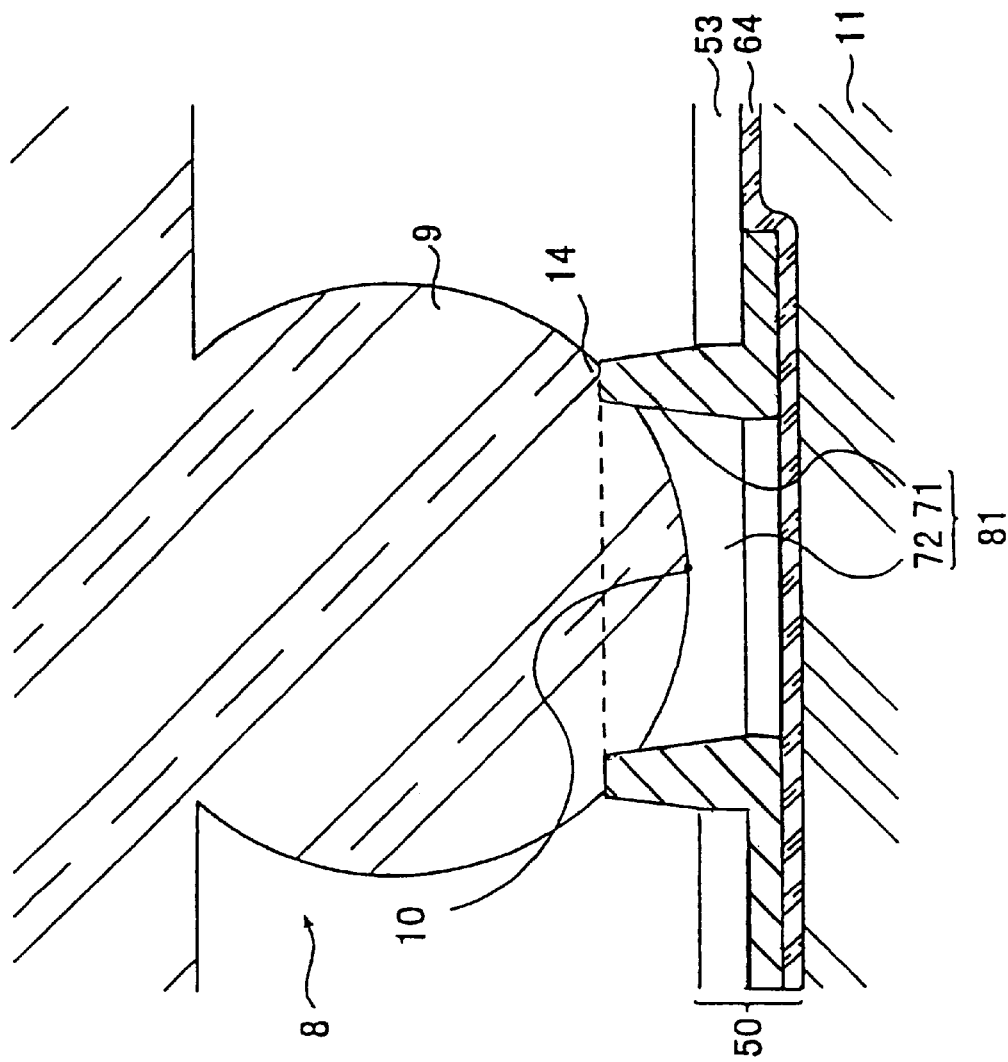
FIG. 11 is an enlarged view of a portion of FIG. 10.

With reference to FIGS. 1–5, socket 1 comprises a base 11, a cover 16, an adaptor 30 and a film substrate 50. In connection with the testing of a semiconductor device of the BGA type, the socket is soldered to the wiring pattern on circuit board 19 by connecting pins 40 that have been mounted on base 11. An overview of socket 1 will be explained below. An accommodating or seating portion 31 formed in adaptor 30 is placed on base 11 for accommodating a semiconductor device 8. Generally spherically shaped semiconductor terminal balls 9, see for example, FIGS. 10, 11, are fixed to the bottom of semiconductor device 8 in a selected array and input/output terminals of the electric element that has been sealed in semiconductor 8 are connected to respective electrically conductive balls 9. Film contacts 81 are arranged on film substrate 50 with each film contact 81 connected to a respective connecting pin 40 mounted in base 11. Accordingly, each film contact 81 is electrically connected to the wiring pattern on circuit board 19.

Figure 5:
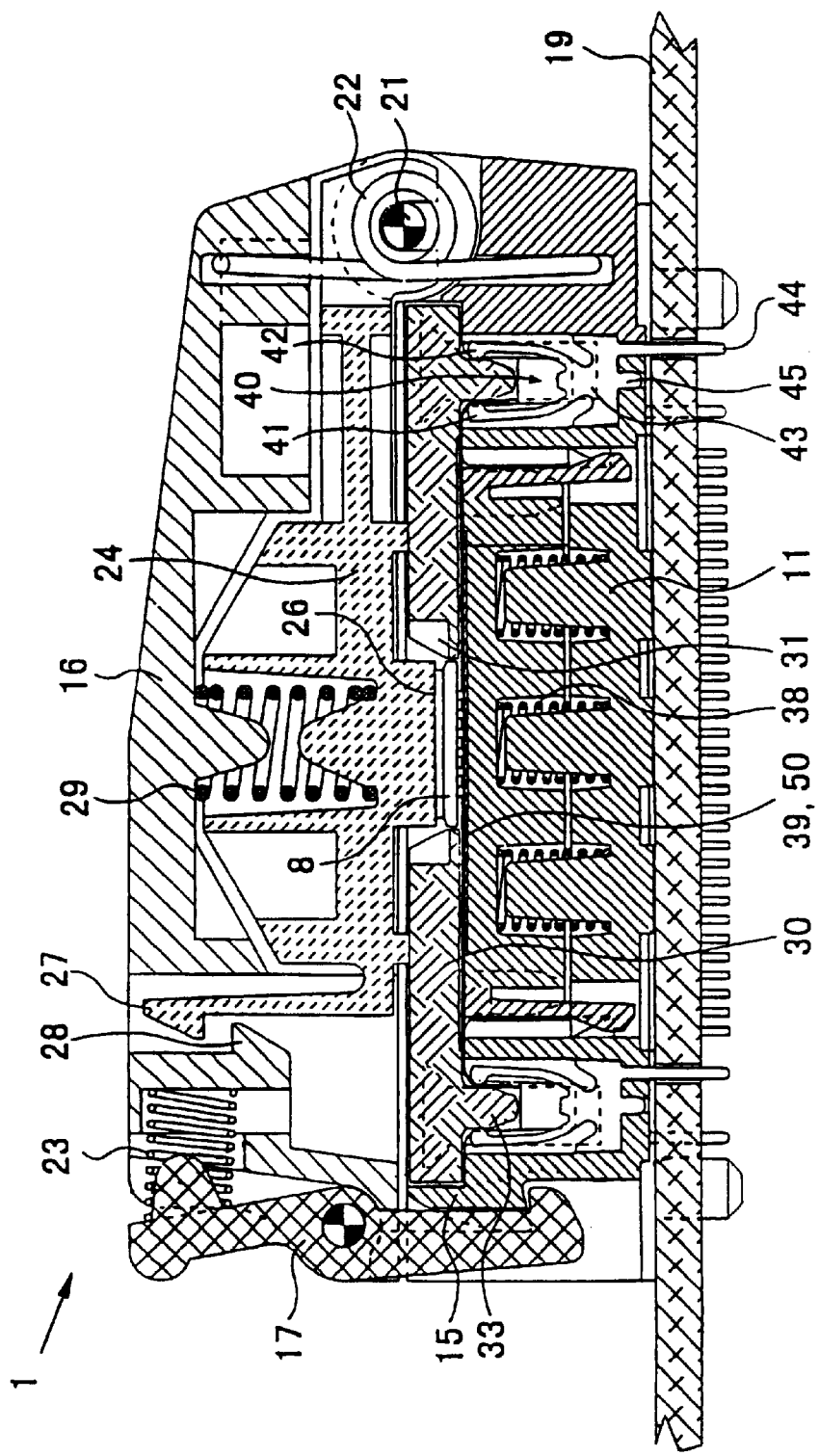
FIG. 5 is a view similar to FIGS. 2–4 in which the cover of the socket has been closed.
Figure 6:
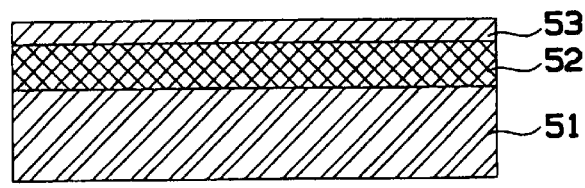
FIGS. 6(a)–6(k) are views shown for explaining the steps for manufacturing the film substrate leading to the formation of a copper wiring film to be used in this invention.
Figure 6:
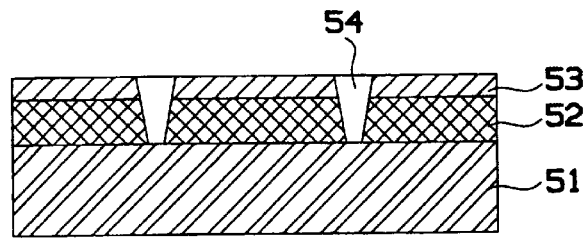
Figure 6:
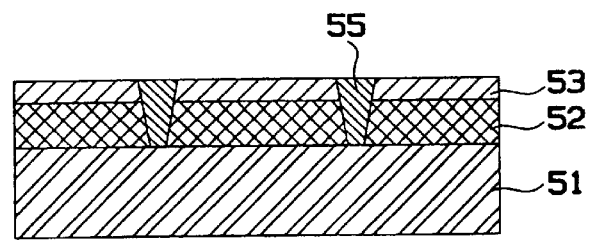
Figure 6:
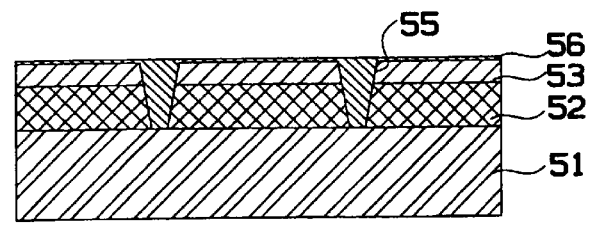
Figure 6:
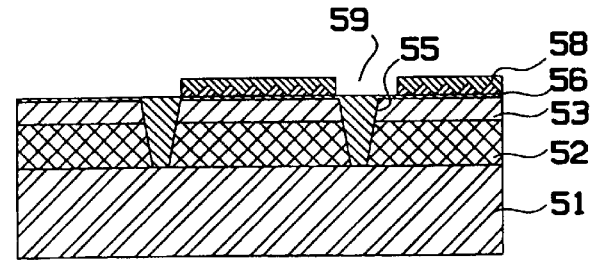
Figure 6:
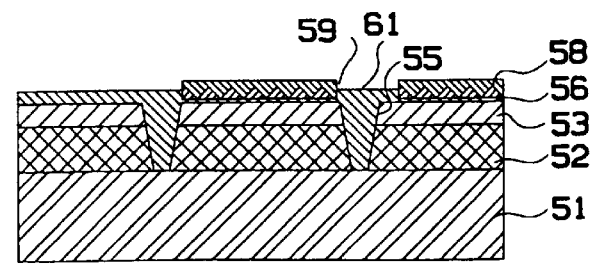
Figure 6:
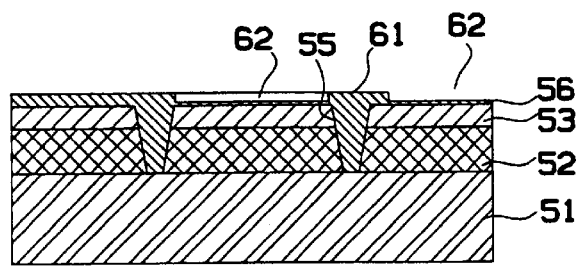
Figure 6:
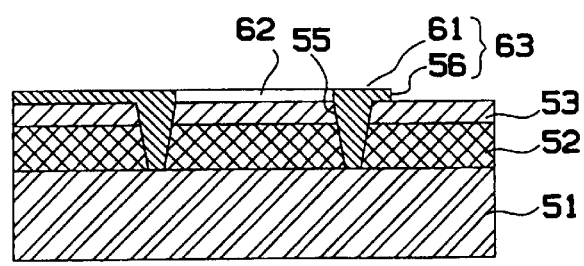
Figure 6:
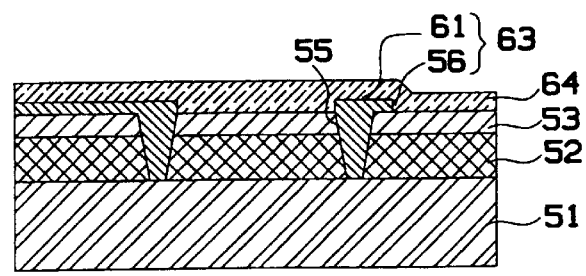
Figure 6:
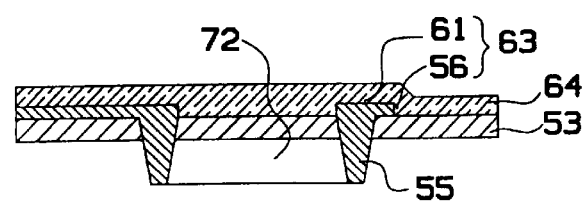
Figure 6:
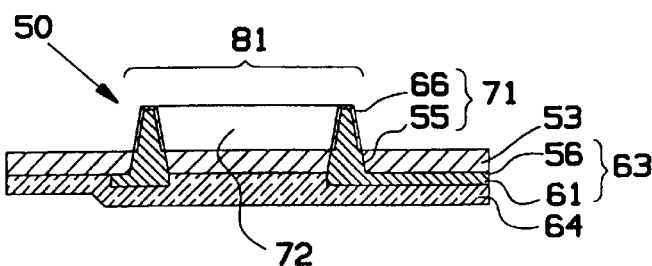

If semiconductor device 8 is placed in the accommodating portion 31 of socket 1 and cover 16 is closed as shown in FIG. 5, the electrically conductive balls are caused to engage respective film contacts 81. As a result, the electric element inside semiconductor device 8 will be electrically connected to the wiring pattern on circuit board 19. In this state, semiconductor device 8 can be subjected to a desired electric test such as a burn-in test by a test circuit, not shown in the drawing, through the circuit pattern on circuit board 19.

Figure 1:
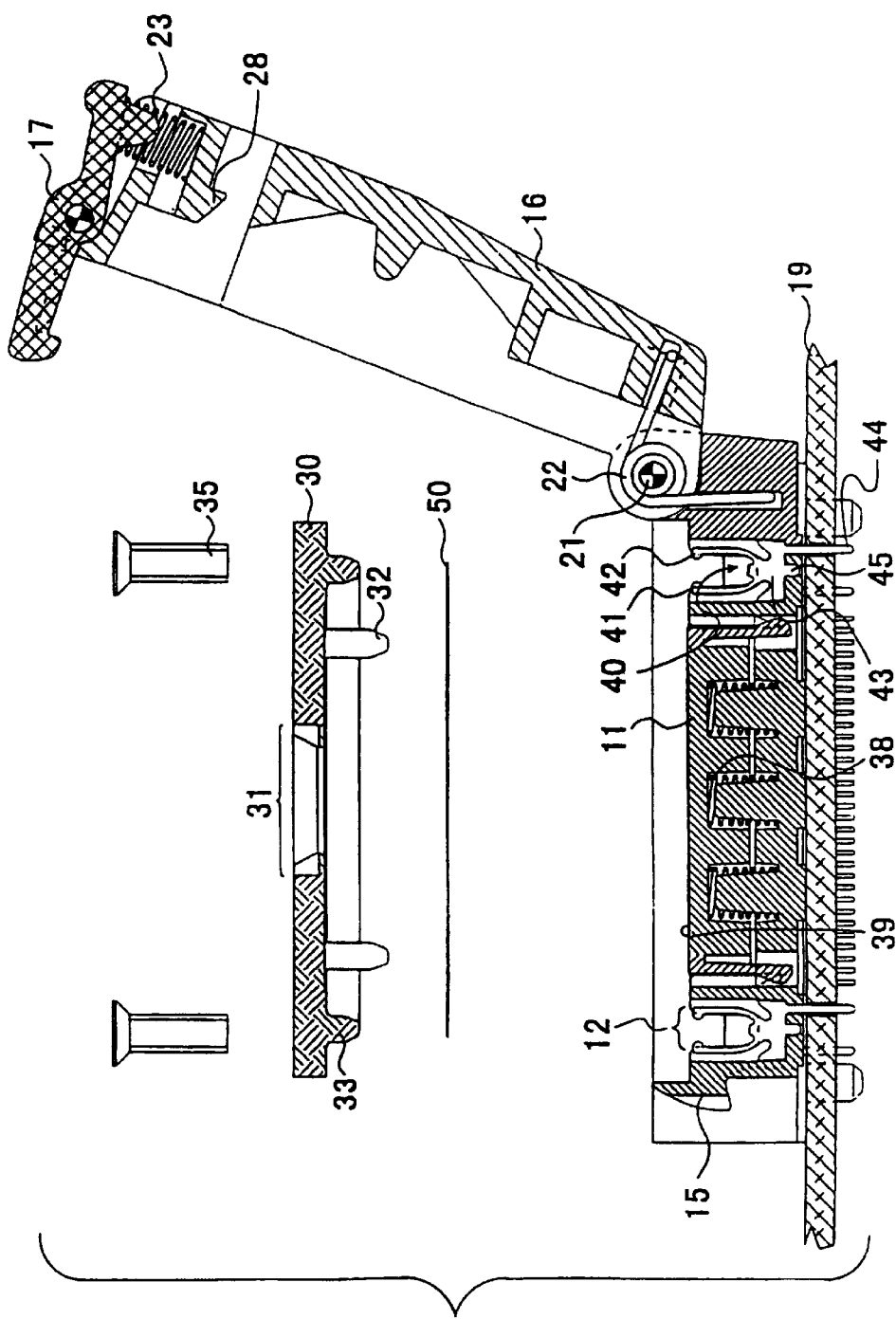
FIG. 1 is a front cross sectional, elevational view of a socket made in accordance with the invention, with parts thereof dismantled and without a compression block.
Figure 8:
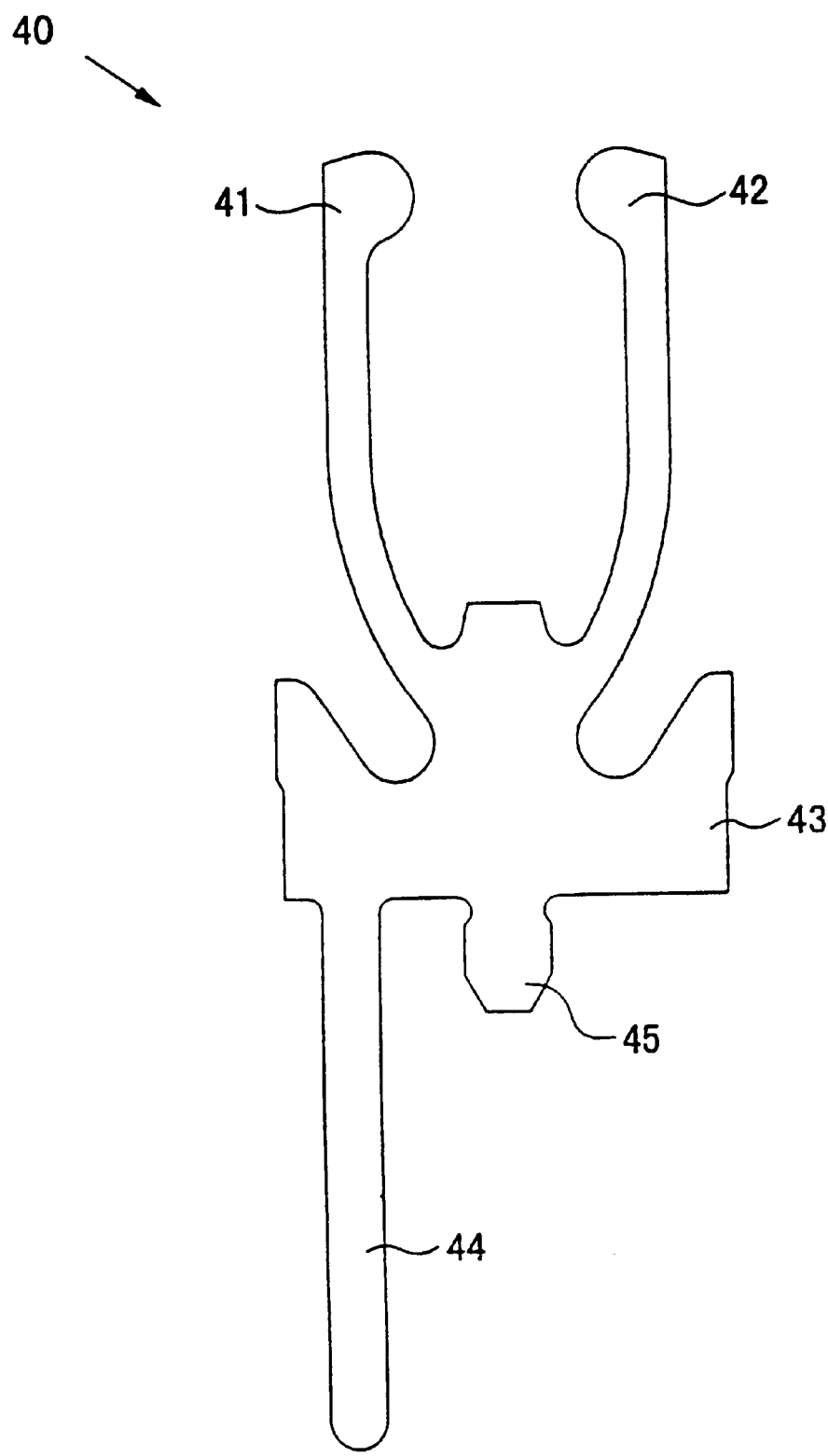
FIG. 8 is a side elevational view showing a connecting pin which can be used in the socket of this invention.

The structure of socket 1 will now be explained in detail below along with the method for its assembly. With reference to FIG. 1, connecting pins 40 are mounted in the peripheral part of base 11 in connection with the assembly of socket 1. Each connecting pin 40 has a pedestal 43, as shown in FIG. 8, with two heads 41 and 42 being flexibly supported through respective arms at the top of pedestal 43. In addition, the lower portion of pedestal 43 is provided with a protrusion 45 at the center thereof along with a leg part 44 depending downwardly therefrom off center at one end thereof. A groove 12 is formed in base 11 along each of the four sides adjacent to the outer periphery for reception of a plurality of connecting pins arranged in parallel inside groove 12. Leg parts 44 alternately face inwardly and outwardly and are inserted into base 11 in the bottom of groove 12 with protrusion 45 being inserted into a recess at the bottom of the groove. Thus each connecting pin 40 is fixed to base 11 by protrusion 45 with its leg part 44 projecting outwardly through a bore in the bottom of the base. Next, a shaft 21 is journaled in bores formed at an end of base 11 for pivotal mounting of cover 16 on the base. The cover will assume an at rest, raised position because of the spring force of a spring 22 installed on shaft 21. The area bounded by groove 12 is formed with a flat surface on which is received an elastic film 39 of silicon resin having a thickness of approximately 100 (mu) m. A film substrate 50 is in turn placed on top of elastic film 39.

Figure 7:
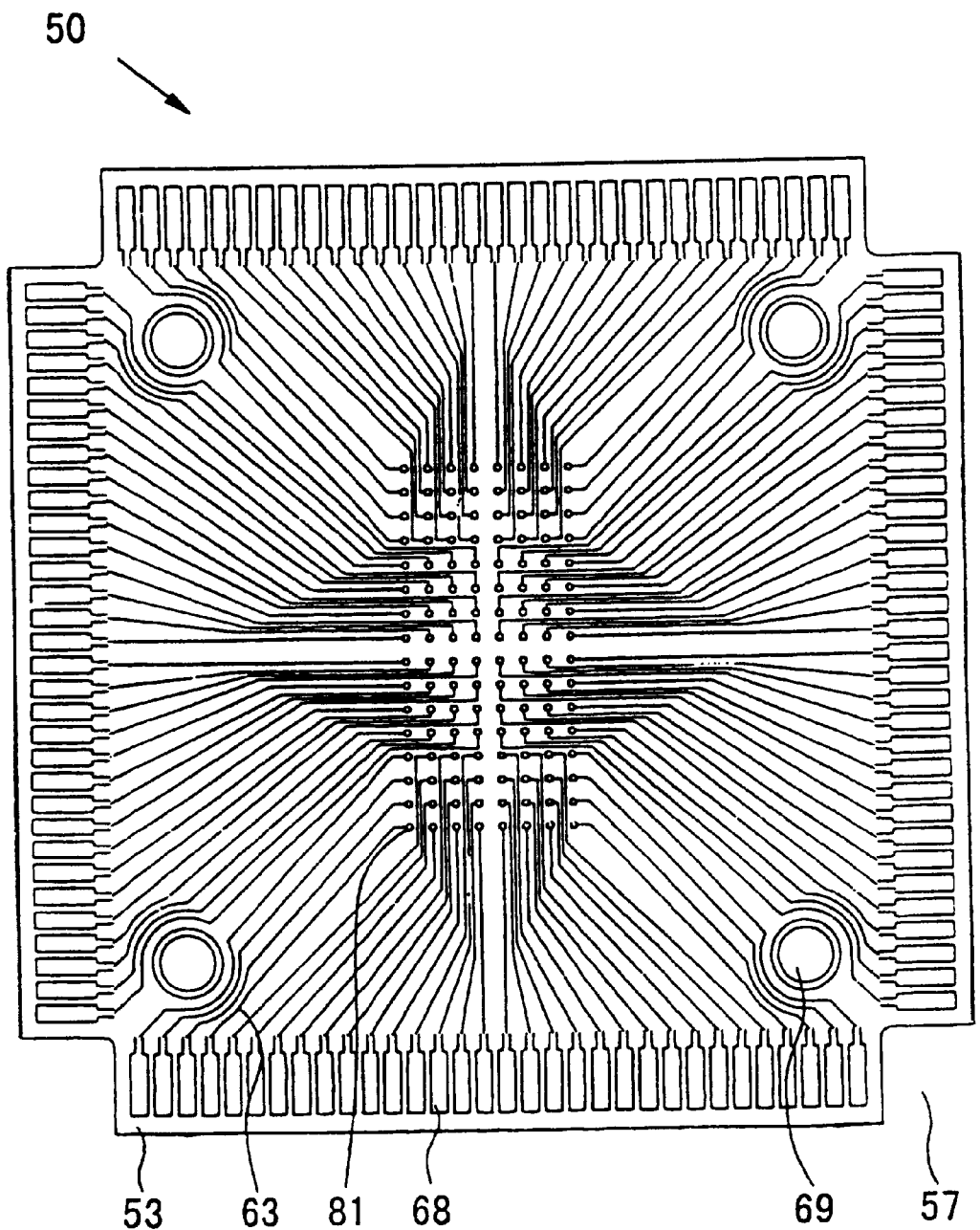
FIG. 7 is a bottom plan view of a film substrate.

With reference to FIG. 7, film substrate 50 in the form of a sheet is shown in a bottom plan view. Substrate 50 is generally square in configuration with cutouts 57 formed at the apexes of the four corners of the film substrate and, in addition, a hole 69 is formed in the vicinity of each corner. The structure of the film substrate with reference to an exemplary contact will be explained below along with its manufacture. Referring to FIGS. 6(a)–6(k), reference 51 indicates a metal plate with a dry film 52 and a support film 53 being placed thereon in this order (refer to FIG. 6(a)). Metal plate 51 may be made of a stainless steel sheet whose thickness is approximately 150 (mu)m and dry film 52 is made of a resin film whose thickness is approximately 50 (mu)m. In addition, support film 53 is made of a polyimide film whose thickness is approximately 50 (mu) m. In this state, a laser beam is applied from the side of support film 53 and a hole or groove 54 in the shape of a ring is created in dry film 52 and support film 53 (FIG. 6(b)). The surface of metal sheet 51 is exposed at the bottom of ring-shaped groove 54 formed by this procedure and, if electroplating of copper is carried out, a copper plug 55 will be formed in ring-shaped groove 54 (refer to FIG. 6(c)). Next, a thin copper film 56 is formed on the surface of support film 53 and on the surface of copper plug 55, as by sputtering (refer to FIG. 6(d)). After the surface of the thin copper film 56 has been coated with a resist material, patterning is carried out thereby forming a resist film 58 and a window 59 (refer to FIG. 6(e)). That part of resist film 58 which has been formed is the part which is to be removed at a later time along with thin copper film 56 and that part where window 50 has been formed is the part which will become a thin wiring film. In this state, electroplating is carried out and copper is precipitated on the exposed surface of thin copper film 56 including the bottom of window part 59, thereby forming a plated film 61. (Reference is to be made to FIG. 6(f).) Next, resist film 58 is removed and thin copper film 56 is exposed (refer to FIG. 6(g)). If etching is carried out in this state and thin copper film 56 is removed, support film 53 under the bottom of thin copper film 56 is exposed. At this time, plated film 61 is also etched. In view of the fact the that thickness of plated film 61 is greater than the thickness of thin copper film 56, however, only the surface part of plated film 61 is slightly etched, with the bulk of plated film 61 being left behind. A two-layered wiring film 63 is formed with the remaining plated film 61 and thin copper film 56 that exists on its bottom (refer to FIG. 6(h)). A cover coating film 64 is formed on the surface of plated film 61 and on the surface of support film 53 that has been exposed. Cover coating film 64 is electrically insulative to provide electrical insulation for wiring film 63 (refer to FIG. 6(i)). If, in this state, the substrate is soaked in a peel-off solution, the film of a two-layered structure with a coated cover film 64 and a support film 53 bound together can be separated from metal sheet 51 with dry film 52 peeled off. In this state, copper plug 55 is exposed to the surface of support film 53 by an amount which is the same as the thickness of the dry film (refer to FIG. 6(j)). Finally, a plated film 66, e.g., nickel plating and gold plating, is formed on the surface of copper plug 55 that has been exposed, thereby enhancing its electrical contact properties. As a result, a ring-shaped protuberant stripe 71 is formed and film substrate 50 is obtained (refer to FIG. 6(k)). Each ring-shaped protuberant stripe 71 with recess 72 formed inside the ring forms a respective film contact 81.

Figure 9:
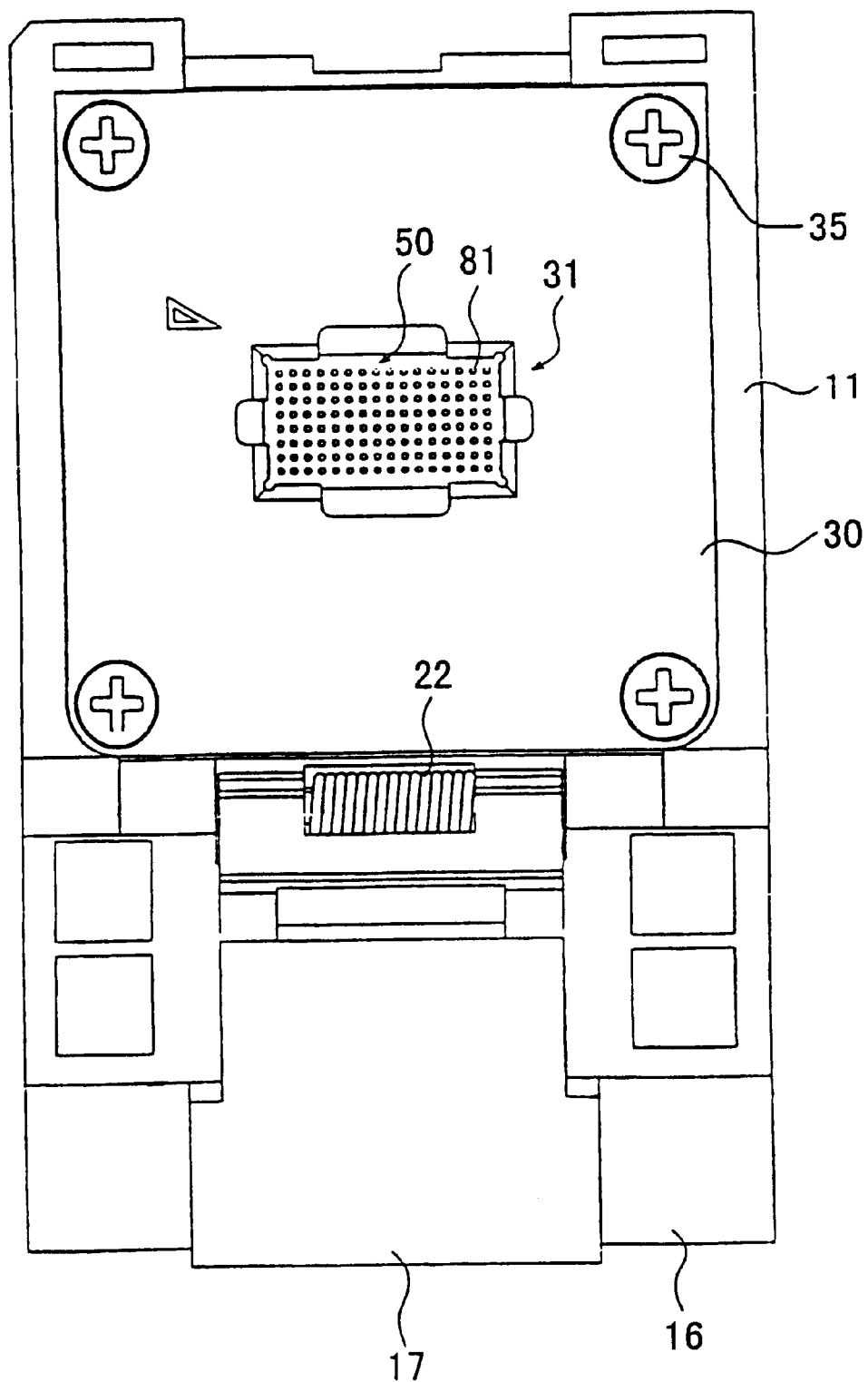
FIG. 9 is a top plan view of the FIG. 5 socket shown with the cover open.

The same number of film contacts 81 are formed as the number of electrically conductive balls 9 on semiconductor device 8 that becomes a subject of the test procedure and these film contacts 81 are arranged in the same selected array in the vicinity of the center of the film substrate 50. Further, the same number of connecting parts or terminal pads 68 as the number of film contacts 81 are provided on the four sides of the film substrate, formed by a relatively wide wiring film 63 with the coated cover on the surface being removed. Each film contact 81 and each connecting part 68 are connected by a respective wiring film 63. Coated cover film 64 of film substrate 50 faces toward the surface of base 11 and holes 69 provided in the vicinity of the four corners of film substrate 50 are placed on top of the holes (which are not shown in the drawing) that have been provided on base 11 for the attachment of elastic film 39. The area of film substrate 50 is formed larger than insulating film 39 and the four-sided portions where connecting parts 68 are arranged are located over groove 12 of base 11 and with holes 69 aligned with corresponding guide holes (not shown) in base 11. In such a state, each connecting part 68 is in contact with one of the two heads 41 and 42 at the top of a respective connecting pin 40 which is closer to the center of the base 11. Next, guide pegs 32 that have been provided on the bottom of adaptor 30 are inserted through holes 69 in film 50 into respective guide holes on the base 11. Compression rib 33 is formed on the bottom of adaptor 30 extending along each of the four sides and, in connection with the insertion of the guide pegs 32 of the adaptor 30 into holes 69, compression rib 33 is simultaneously pressed into the gap between the heads 41 and 42 of the connecting pins 40. In connection with its insertion between heads 41 and 42, compression rib 33 folds the film substrate 50 into groove 12 and, while each connecting part 68 of film substrate 50 is in engagement with a respective head 41 (or head 42), the heads are pushed open, with a result that the respective connecting parts 68 and the heads 41 (or heads 42) slide relative to one another, thereby electrically connecting film contacts 81 to connecting pins 40. After adaptor 30 has been arranged on film substrate 50, adaptor 30 is screwed on and fixed to base 11 by means of screws 35. FIG. 9 is a plan view of the socket in this state. At the center of adaptor 30, there is provided an opening having a size to conform with the size of a semiconductor device 8 which is to be the subject of the test procedure. The accommodating portion 31 defines an opening aligned with film substrate 50 which is supported on base 11 and which is exposed at the bottom of the opening.

Figure 2:
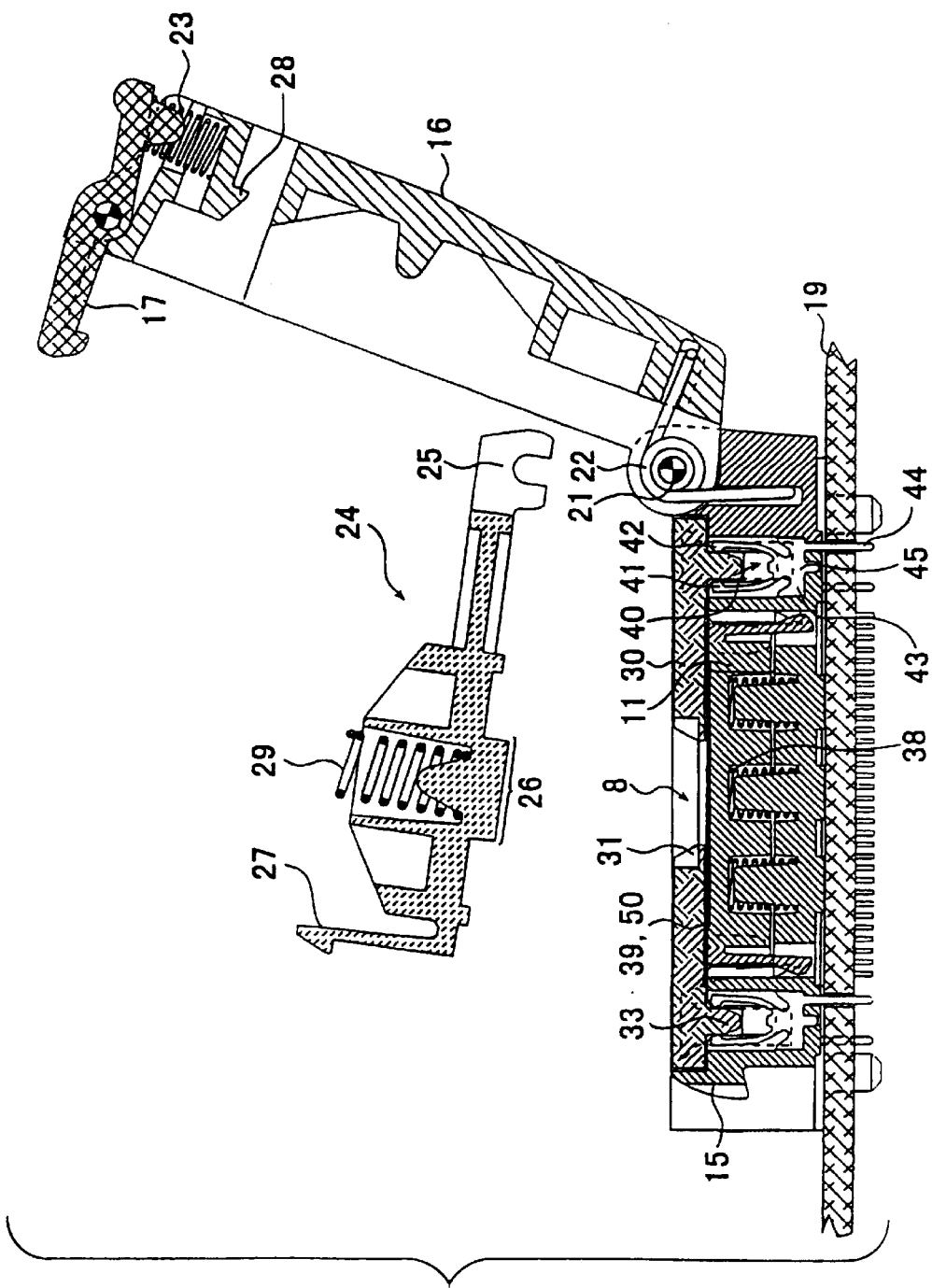
FIG. 2 is a view similar to FIG. 1 with the parts assembled shown for explaining the insertion of the compression block of the socket shown separated from the socket.
Figure 3:
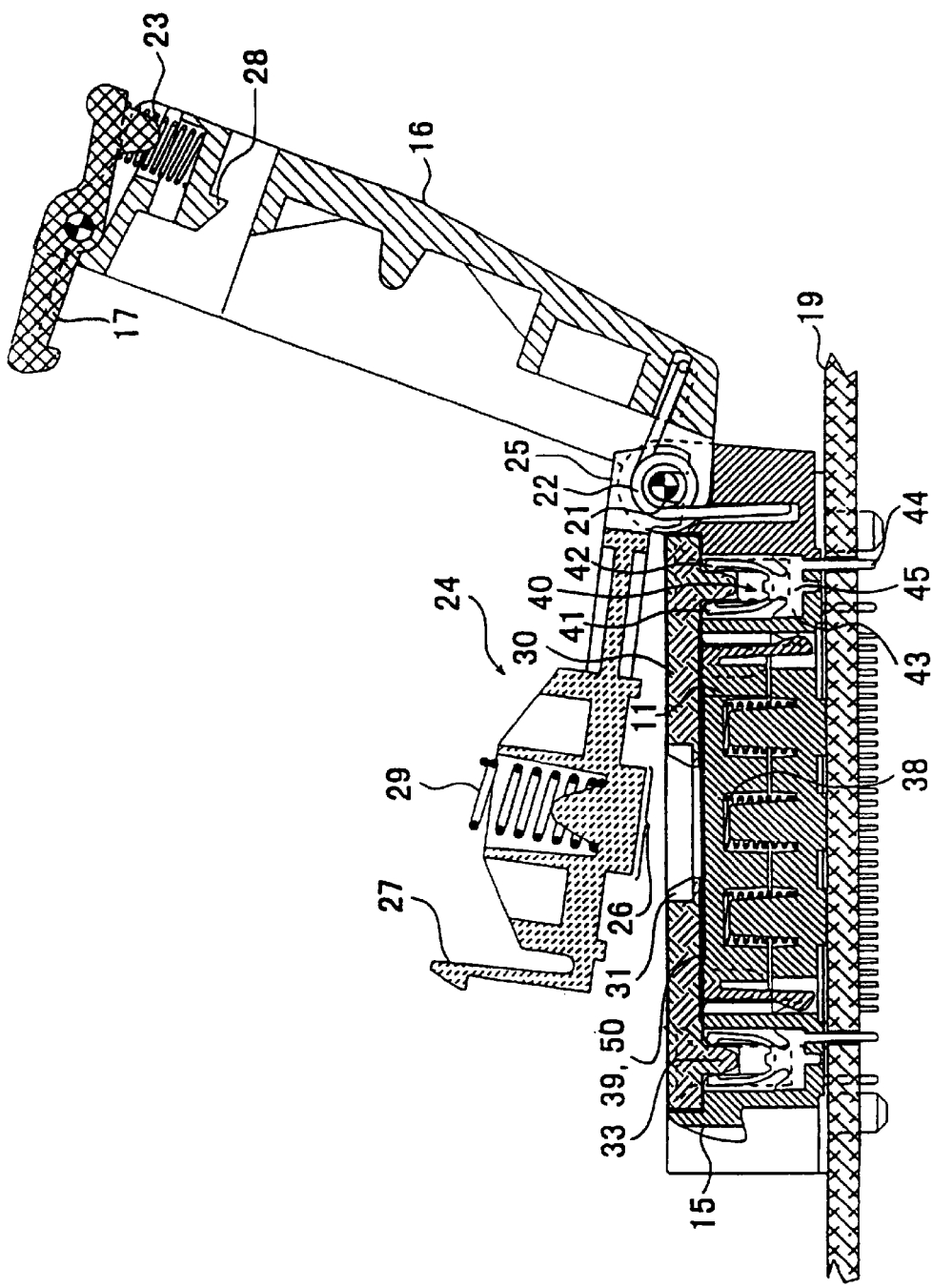
FIG. 3 is a view similar to FIG. 2 for explaining the manner in which the compression block is installed in the socket.
Figure 4:
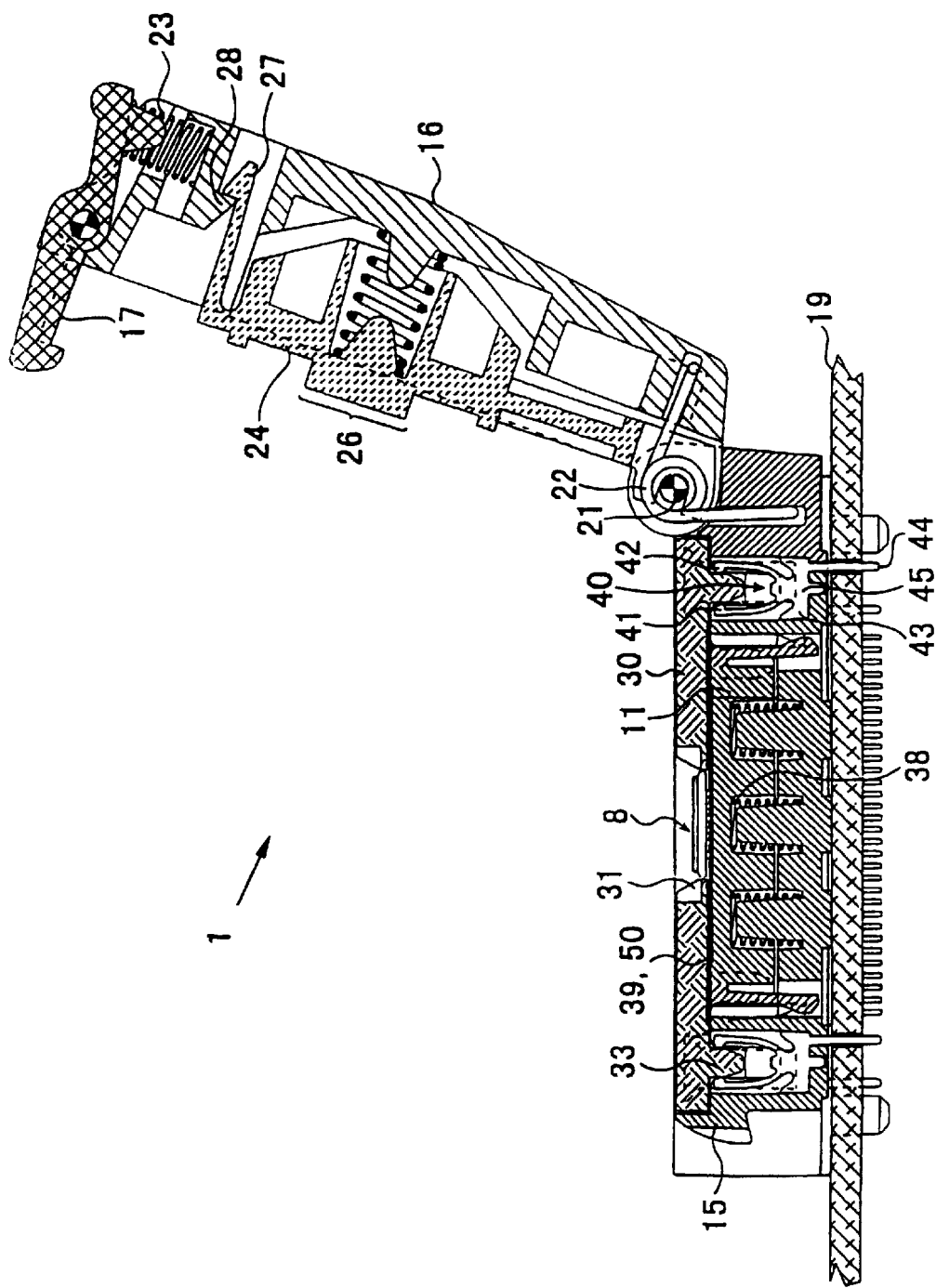
FIG. 4 is a view similar to FIGS. 2 and 3 shown for explaining the state in which the semiconductor device has been accommodated in the socket.

Referring to FIG. 2, reference numeral 24 indicates a compression block comprising a compression face 26, a spring 29 arranged at its back, a latch 27 and a mounting part 25. As shown in FIG. 3, compression surface 26 faces toward the top side of base 11, the mounting part 25 is inserted onto shaft 21 so that compression block 24 is engaged with shaft 21. Next, the compression block 24 is pivoted to the bottom side of cover 16 and, after spring 29 has been placed in touch with cover 16, it is further pressed in and, in the state of spring 29 being compressed, latch part 27 of compression block 24 is engaged with engaging part 28 of cover 16, as shown in FIG. 4. Latch part 27 is pressed against engaging part 28 by the spring force of spring 29 and the engaged state between latch part 27 and engaging part 28 is thus maintained. Because of this, compression block 24 is flexibly held to cover 16. At the bottom of accommodating part 31, film contacts 81 that have been provided on film substrate 50 are exposed and each film contact 81 is arranged at such a position that it is aligned with a respective electrically conductive ball 9 provided on the semiconductor device which becomes the subject of the test procedure. When semiconductor device 8 is received in accommodating part 31, therefore, each electrically conductive ball 9 on the bottom of semiconductor device 8 engages the protuberant stripe 71 of a respective film contact 81. After semiconductor device 8 is received in accommodating part 31, cover 16 is pivoted and, after compression surface 26 evenly contacts the surface of the semiconductor device 8, spring 23 that has been provided on latch 17 of cover 16 is compressed and latch part 17 is pushed in until it is engaged with engaging part 15 of base 11. Latch 27 of compression block 24 and engaging part 28 of cover 16 separate from one another, with a result that spring 29 on back of block 24 is compressed. In this state, latch 17 of cover 16 is pressed against engaging part 15 of base 11, with the engaged state being thus maintained. In addition, compression block 24 compresses semiconductor device 8 by the spring force of spring 29 that has been provided on the compression block 24.

Inside base 11, on the other hand, springs 38 that flexibly support the part where compressible film 39 and film substrate 50 are placed, spring back. As shown in FIG. 10, therefore, electrically conductive balls 9 are pressed against respective protuberant stripe 71 of film contacts 81. An enlarged view of the state in which film substrate 81 and an electrically conductive ball 9 are in contact with each other is shown in FIG. 11. Protuberant stripe 71 is formed having a selected outer perimeter and height relative to the size of the electrically conductive ball such that the contact engages the side peripheral part of electrically conductive ball 9 at its top 14 and the bottom most part 10 of the electrically conductive ball is located inside recess 72 which is surrounded by protuberant stripe 71 out of engagement with cover coating film 64 which is exposed to the bottom of recess 72 and other members. As semiconductor device 8 is pressed downwardly, top part 14 of protuberant stripe 71 cuts into the side peripheral part of electrically conductive ball 9, with a result that film contact 81 and electroconductive ball 9 are firmly electrically connected. In this case, too, bottom part 10 of the electrically conductive ball 9 is not pressed against cover coating film 64 and other members, with a result that there is no deformation or crushing of the lower most portion of electrically conductive ball 9.

Connecting pins 40 that have been mounted on base 11 are soldered and fixed to the wiring pattern on circuit board 19 through legs 44 and the wiring pattern on circuit board 19 in turn is connected to the testing circuit. In the state of cover 16 being closed, therefore, the electric element that has been sealed in semiconductor device 8 assumes a state in which it is connected to the testing circuit through electrically conductive balls 9, film contacts 81, wiring film 63, connecting parts 68, connecting pins 40 and the wiring pattern on circuit board 19. Because of this, it becomes possible to impress a prescribed voltage on the input, output terminals of the electric element in a desired atmosphere and carry out an electrical test of semiconductor device 9. After the test, the engagement of latch 17 is released, cover 16 is pivoted and semiconductor device 8 is taken out of accommodating portion 31. Next, a semiconductor device which has not been tested is placed in accommodating portion 31, cover 16 is closed and a similar test is conducted.

Figure 12A:
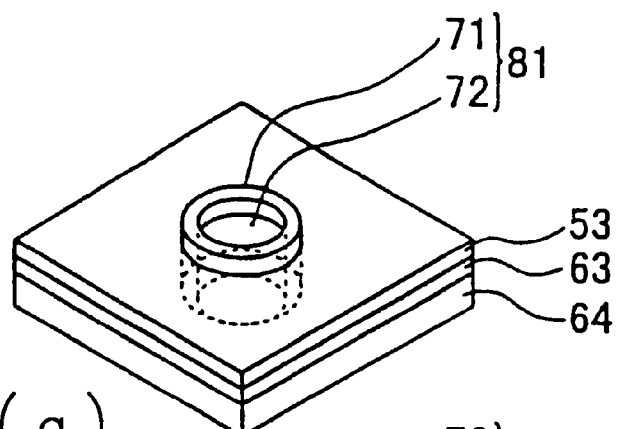
FIGS. 12(a)–12(d) show examples of the film contact.
Figure 12B:
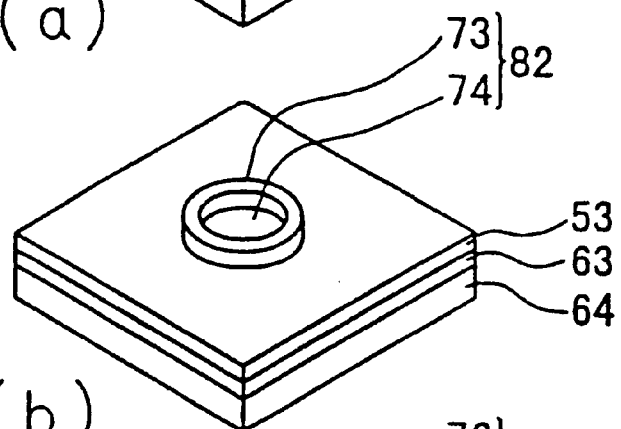
Figure 12C:
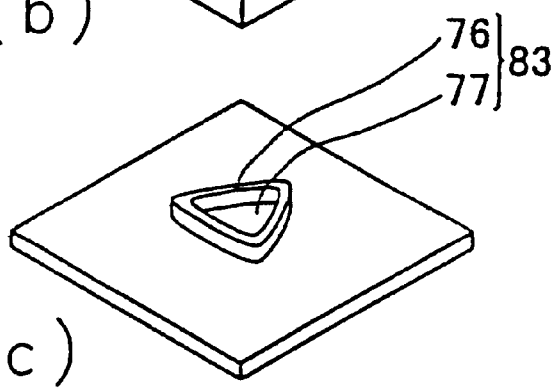
Figure 12D:
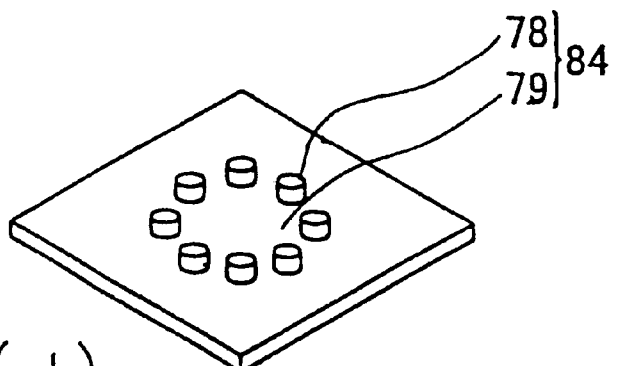
Figure 12E:
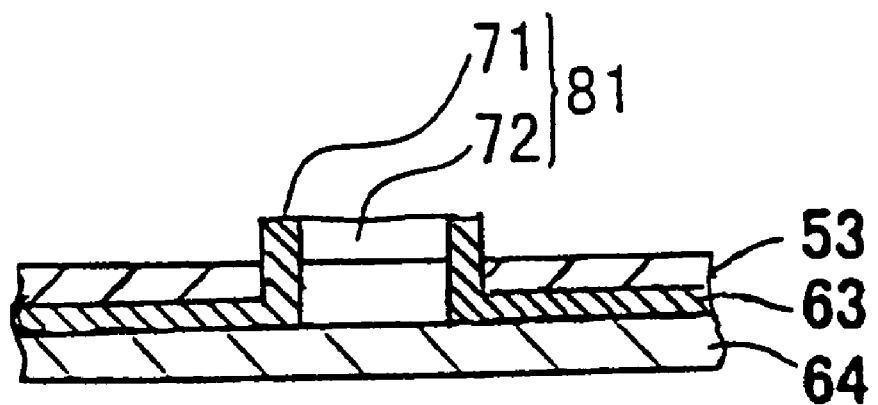
FIG. 12(e) is a cross sectional view of FIG. 12 (a) and FIG. 12(f) is a cross sectional view of FIG. 12 (b)
Figure 12F:
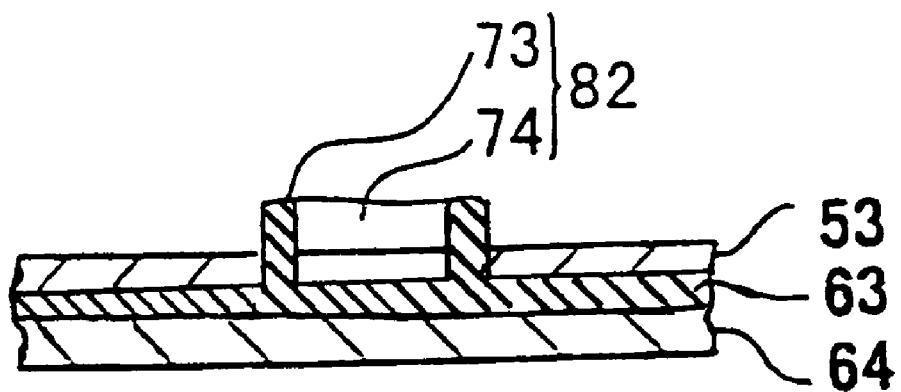
Figure 13A:
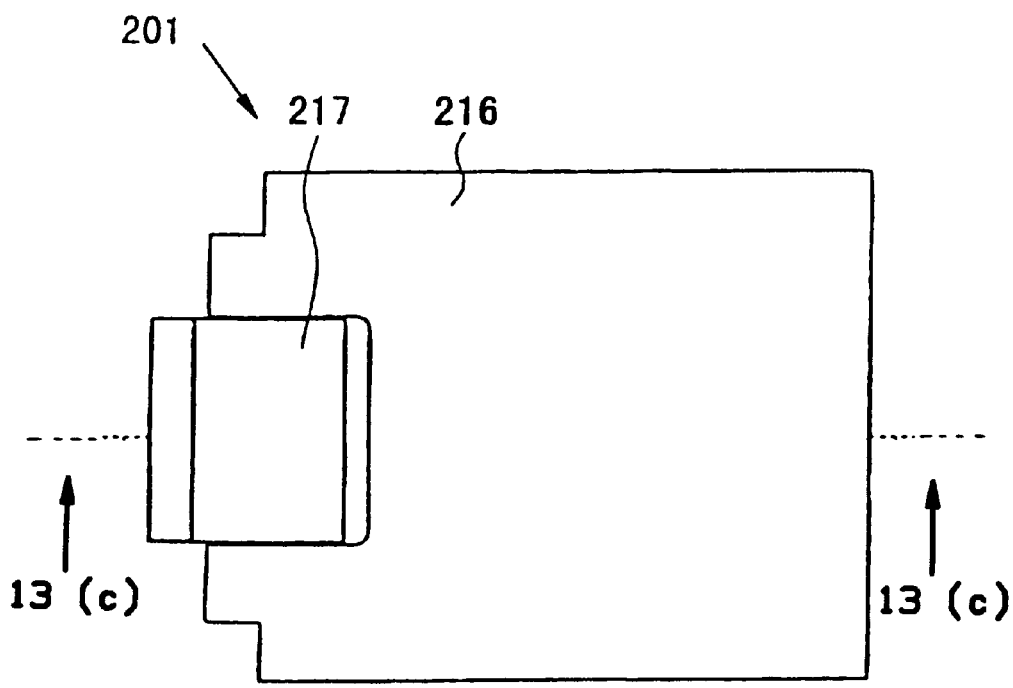
FIGS. 13(a) is a top plan view of a prior art socket.
Figure 13B:
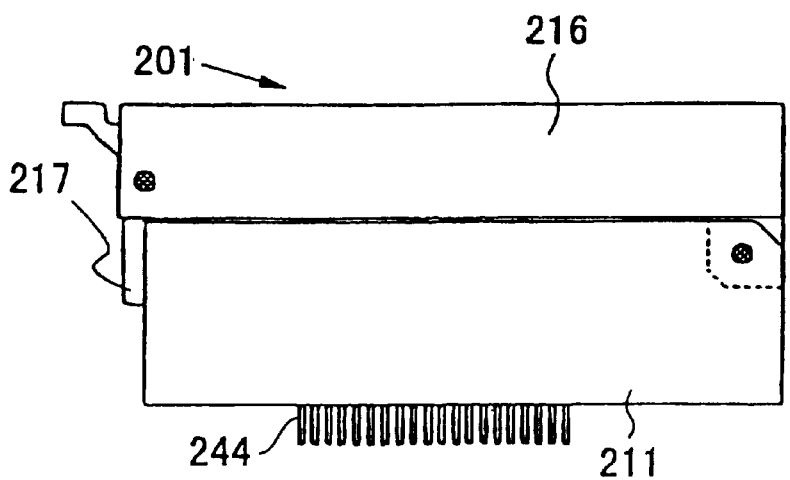
FIG. 13(b) is a front elevational view of the FIG. 13(a) socket.
Figure 13C:
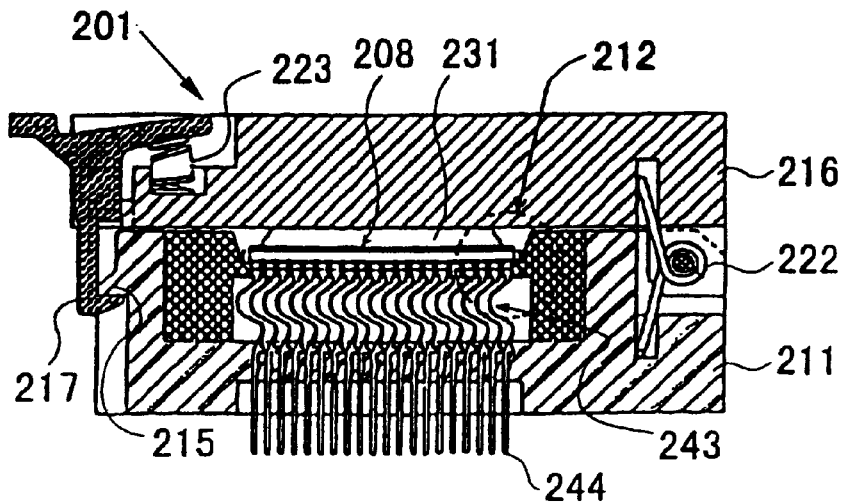
FIG. 13(c) is a cross section taken on line (13(c)–13(c), and FIG. 13(d) is an enlarged portion of FIG. 13(c).
Figure 13D:
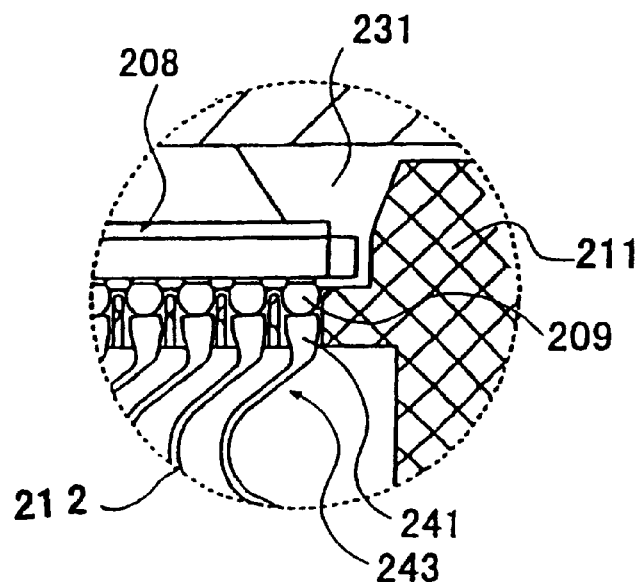

According to socket 1 of this invention, it becomes possible to speedily test a large number of semiconductor devices, as explained above. As bottom part 10 of balls 9 are not crushed, the semiconductor devices on which the test has been completed do not produce a connection failure in connection with mounting of the semiconductor device for its intended use. As film contacts 81 are formed by etching and plating, moreover, their arrangement in a dense pattern becomes possible, thereby making it possible to test semiconductor devices of a narrow pitch. In the case of the aforementioned film contact 81, copper wiring 63 on the bottom of recess part 72 was removed as shown in FIGS. 12(a), 12(e). However, if desired, copper wiring 63 may be exposed at the bottom of recess 74 surrounded by protuberant stripe 73 shown at 82 in FIGS. 12(b), 12(f). In addition, the aforementioned film contacts 81 and 82 have protuberant stripes 71 and 73 of a circular ring shape; however, the contacts are not limited to such a configuration. For example, film contacts 83 may be formed with protuberant stripes 76 of a generally triangular ring shape with a recess 77 inside the protuberant stripes as shown in FIG. 12(c). In addition, the film contacts may comprise a protuberant stripe of a square or other polygon ring shape with the recess inside. Moreover, the film contacts of the socket according to this invention are not restricted to ones having protuberant stripes 71, 73 and 76. The film contacts may also comprise an arrangement of a plurality of spaced protuberant knobs 78 forming a circular or other polygon 84 and by using the central portion as the recess 79.

In short, film substrates which can be used in the socket according to this invention can be any such film substrate which can be placed out of engagement with the bottom portion of the balls that have been arranged on the bottom of the semiconductor device yet which have a film contact that are electrically connected to the balls.

In cases where BGA type semiconductor devices of different shapes or arrays are to be measured by using socket 1, the socket does not have to be removed from circuit board 19, provided that a suitable film substrate and adaptor which are in conformity with the shape of the semiconductor device and the array of the electrically conductive balls of the semiconductor device which is the subject of the test is substituted therefor.

Thus, in accordance with the invention, BGA type semiconductor devices with a narrow pitch of the electrically conductive terminal balls can be tested. Since there is a satisfactory electrical contact between the electrically conductive balls and the film contacts, it becomes possible to accurately carry out the electric test. Since the bottom most portion of the electrically conductive balls are not engaged and therefore are not deformed, there will be no electrical connection failure at the time of mounting the semiconductor devices for their intended purpose.

Although the present invention has been described and illustrated through several embodiments thereof, it is to be understood that the invention is not to be so limited since changes and modifications may be made therein which are within the intended scope of the invention as hereinafter claimed.

What is claimed:

1. A socket for removably receiving electric parts having a plurality of electrically conductive terminal balls disposed along a bottom surface thereof for testing such parts comprising:

a base formed of electrically insulative material having a generally flat top surface, electrically conductive pins mounted in the base, the pins each having a leg received through an aperture in the base for connection to a circuit board, an electric part seating member having a bottom wall with a terminal receiving opening therein, the seating member received on the base, a contact film sheet received on the flat top surface, the sheet having a dielectric layer formed with electrically conductive terminal pads along at least one edge electrically interconnected with respective electrical contacts projecting upwardly from the sheet, the terminal pads electrically connected with respective electrically conductive pins and the contacts formed in a generally annular projection having a selected height and a selected outer perimeter relative to the size of the terminal balls such that the electrically conductive terminal balls of an electric part received on the seating member and extending through the opening in the bottom wall thereof will engage respective aligned electrical contacts at a peripheral location removed from the bottom most portion of the terminal balls with the bottom most portion of the terminal balls out of engagement with the electrical contacts.

2. A socket according to claim 1 in which each annular contact is generally circular projection.

3. A socket according to claim 1 in which each annular contact forms a continuous, closed projection.

4. A socket according to claim 1 in which each annular contact comprises discontinuous projection.

5. A socket according to claim 1 in which each annular contact comprises a generally triangular projection.

6. A socket according to claim 1 in which the contact sheet is flexible, and a groove is formed in the base along at least one side of the top flat surface and a portion of the contact film sheet having the electrically conductive pads extends downwardly into the groove, the conductive pins each formed with an upwardly extending arm and a compression portion extends downwardly from the seating member into the groove forcing the arms of the conductive pins into electrical engagement with respective electrically conductive pads.

7. A socket according to claim 6 further comprising a compressible sheet disposed intermediate to the top flat surface and the contact film sheet.

8. A socket according to claim 7 further comprising a compression member movable into alignment with an electric part received in the socket for applying a force to the electric part against the contact film sheet.

9. A socket according to claim 7 in which the compressible sheet is formed of silicon resin of approximately 100 (mu) m thickness.

10. A socket according to claim 1 in which the selected height of the annular contact projection is approximately 50 (mu) m.

* * * * *